United States Patent
Kudelka et al.

[11] Patent Number: 6,066,527
[45] Date of Patent: May 23, 2000

[54] BURIED STRAP POLY ETCH BACK (BSPE) PROCESS

[75] Inventors: Stephan Kudelka, Fishkill; Alexander Michaelis, Wappingers Falls, both of N.Y.

[73] Assignee: Infineon Technologies North America Corp., San Jose, Calif.

[21] Appl. No.: 09/361,055

[22] Filed: Jul. 26, 1999

[51] Int. Cl.[7] .............................................. H01L 21/8242
[52] U.S. Cl. ........................ 438/243; 438/248; 438/386; 438/391
[58] Field of Search ................................. 438/243, 248, 438/386, 391, 244, 387

[56] References Cited

U.S. PATENT DOCUMENTS

| | | | |
|---|---|---|---|
| 5,225,697 | 7/1993 | Malhi et al. | 257/302 |
| 5,770,484 | 6/1998 | Kleinhenz | 438/249 |
| 5,981,332 | 11/1999 | Mandelman et al. | 438/246 |
| 6,008,104 | 12/1999 | Schrems | 438/386 |

*Primary Examiner*—Charles Bowers
*Assistant Examiner*—Jack Chen
*Attorney, Agent, or Firm*—Donald B. Paschburg

[57] ABSTRACT

In accordance with the present invention, a method for etching back filler material for a buried strap for deep trench capacitors includes the steps of forming a trench in a substrate, filling the trench with a first filler material, recessing the first filler material to a predetermined depth relative to a dielectric collar formed in the trench, forming a divot by etching back the dielectric collar, depositing a liner over the first filler material and portions of the substrate exposed by the formation of the trench, and depositing a second filler material on the liner. A surface of the second filler material is prepared by etching the surface with a wet etchant to provide a hydrogen terminated silicon surface. Wet etching the second filler material is performed to etch back the second filler material selective to the liner and the substrate. The second filler material is etched to form a buried strap.

25 Claims, 5 Drawing Sheets

BURIED STRAP POLY ETCH BACK (BSPE) PROCESS

BACKGROUND

1. Technical Field

This disclosure relates to semiconductor fabrication and more particularly, to an improved method for etching back buried strap polysilicon for deep trench capacitor storage node formation.

2. Description of the Related Art

Semiconductor memory devices such as dynamic random access memories (DRAMs) include capacitors accessed by transistors to store data. Deep trench (DT) capacitors are among the types of capacitors used in DRAM technology. Deep trench capacitors are typically buried within the semiconductor substrate. To connect the deep trench capacitor to a transfer device (access transistor) a buried strap contact has to be formed. The buried strap contact formation is done by recessing a DT oxide collar to form a divot or recessed portion and subsequently filling the collar divot with doped polysilicon, which is also used for a storage node formed in the deep trench. The polysilicon deposition is performed by a chemical vapor deposition (CVD) process, i.e., all of the exposed surface is covered by a polysilicon layer. Prior to the polysilicon deposition a high temperature nitridation is typically performed to form an ultra-thin nitride layer. This nitride layer reduces defect generation from the buried strap interface which is the root cause for variable retention time (VRT) problems.

Since the polysilicon is only needed in the divot, the other trench parts have to be cleaned again (i.e., polysilicon removal). This process is called the buried strap poly etch-back (BSPE). Currently, this BSPE process is done by means of a chemical dry etch process (CDE) particularly a dry, isotropic reactive ion etch (RIE) process which removes a constant amount of polysilicon.

Disadvantages of this process include:

1. The process is non-selective to silicon of the deep trench sidewall. Therefore, overetch into the crystalline silicon is possible resulting in poor control for the process.

2. The process leaves poly silicon in a pad oxide undercut which is formed in prior process steps. The pad oxide is typically formed on a top surface of the substrate for protection of the surface for later gate oxidation. A portion of the pad oxide adjacent the deep trench is typically etched. When polysilicon is formed, these etched portions fill with polysilicon. This polysilicon causes gate oxide reliability problems especially if vertical devices (i.e., access transistors on the DT sidewall) are formed.

3. The RIE tool is a single wafer tool (poor throughput). Only one wafer at time is typically processed with this tool.

Therefore, a need exists for an improved method for a buried strap polysilicon etch back process. A further need exists for a buried strap polysilicon etch back process which provides higher throughput and better performance characteristics over the prior art.

SUMMARY OF THE INVENTION

In accordance with the present invention, a method for etching back filler material for a buried strap for deep trench capacitors includes the steps of forming a trench in a substrate, filling the trench with a first filler material, and recessing the first filler material to a predetermined depth relative to a dielectric collar formed in the trench. The recessing of the dielectric collar forms a collar divot. A dielectric layer is grown over the first filler material and portions of the substrate exposed by the formation of the trench, and a second filler material is deposited on the dielectric layer and in the collar divot. A surface of the second filler material is prepared by etching the surface with a wet etchant to provide a hydrogen terminated silicon surface, and the second filler material is wet etched to etch back the second filler material selective to the dielectric layer and the substrate. The second filler material is etched to form a buried strap.

In accordance with the present invention, a method for etching back polysilicon selective to crystalline silicon for semiconductor fabrication includes the steps of providing a crystalline silicon substrate having trenches formed therein, forming an oxide collar in an upper portion of the trenches, depositing a polysilicon material in the trenches and recessing the polysilicon material to a predetermined depth below a top portion of the oxide collar, recessing the oxide collar to form a divot in each trench, growing a nitride layer along exposed surfaces of the substrate in the trenches, in the divots and on the polysilicon material, depositing a filler material to fill the trenches and divots, preparing a surface of the filler material by etching the surface with a wet etchant to provide a hydrogen terminated silicon surface and wet etching the filler material by employing ammonium hydroxide to etch back the filler material selective to the substrate and the nitride layer.

In alternate methods, the step of preparing a surface may include the step of preparing the surface by wet etching the surface with hydrogen fluoride. The step of preparing a surface may include the step of preparing the surface by wet etching the surface at a temperature of about 25° C. The step of wet etching may include the step of wet etching the second filler material by employing ammonium hydroxide. The step of wet etching may also include the step of wet etching the second filler material at temperatures of between about 25° C. to about 85° C. The step of wet etching may include the step of wet etching the second filler material in a batch process. The second filler material preferably includes polysilicon or amorphous silicon. The dielectric layer may include nitride. The nitride may include a thickness of about 0.8 nm. The step of wet etching may also include the step of wet etching the second filler material selective to the substrate with a selectivity of at least 40 to 1. The step of wet etching may includes the step of wet etching the filler material by employing ammonium hydroxide or potassium hydroxide for between about 40 second to about 800 seconds. The filler material preferably includes polysilicon or amorphous silicon.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly, to a method for buried strap polysilicon etchback (BSPE). The present invention includes a wet BSPE process using a base solution or chemistry (e.g., $NH_4OH$ and/or KOH) for better process control. The present invention improves throughput by permitting batch processing instead of single wafer processing. The present invention further permits the use of wet etch tanks instead of a reactive ion etch tool.

Figure 1:
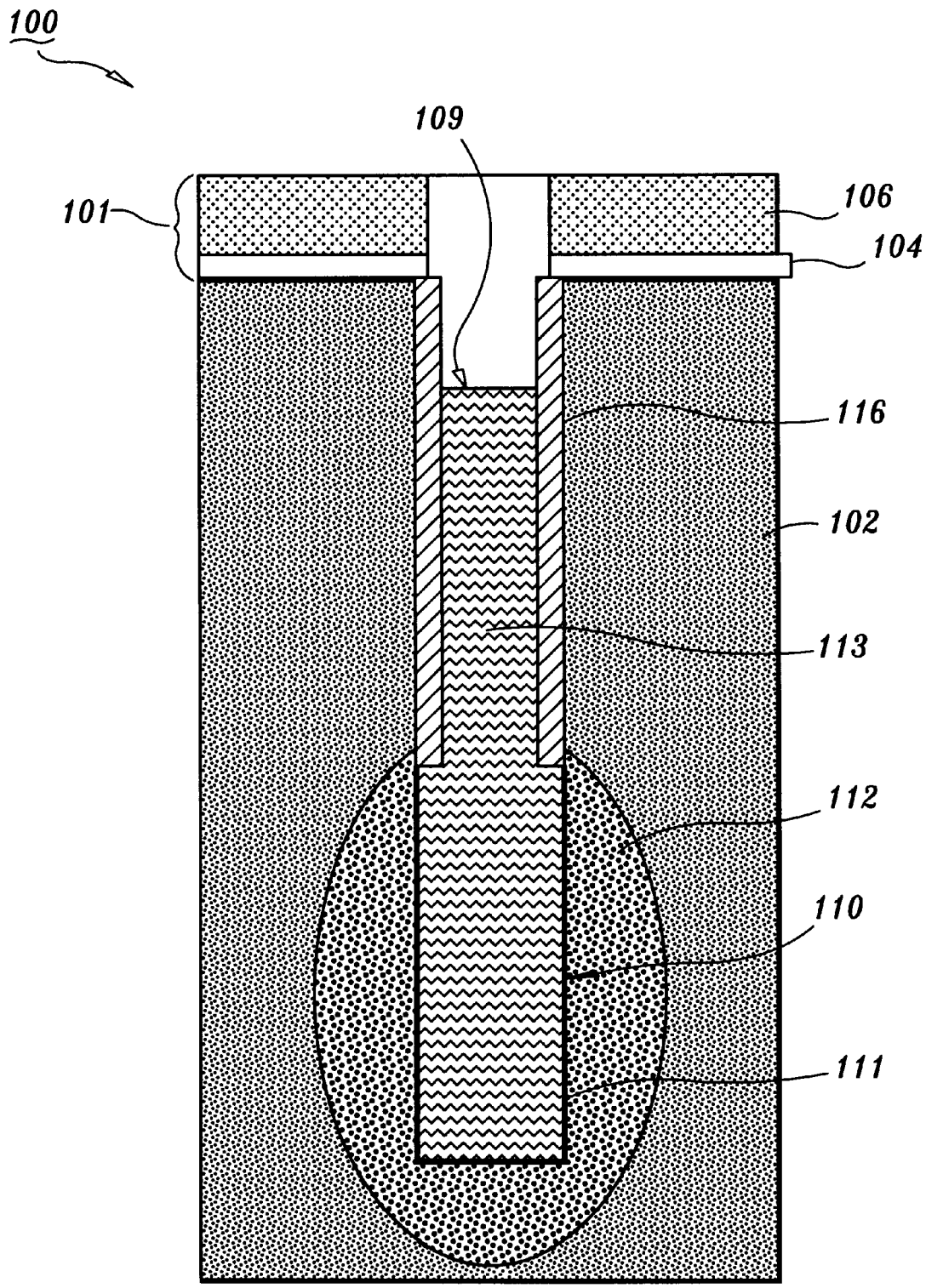
FIG. 1 is a cross-sectional view of a semiconductor device having a trench with a collar formed therein, filled with a filler material which is recessed for processing in accordance the present invention.

Referring now in specific detail to the drawings in which like reference numerals identify similar or identical elements throughout the several views, and initially to FIG. 1, a memory device 100 includes a substrate 102 having a pad stack 101 formed thereon. Memory device 100 may include a dynamic random access memory (DRAM), synchronous DRAM, static RAMs, read only memories or other memory integrated circuits. Substrate 102 is preferably a monocrystalline silicon substrate, however other substrates may be employed, for example a silicon on insulator substrate. Pad stack 101 may include various layers of materials used to further process memory device 100. In a preferred embodiment, pad stack 101 includes an oxide layer 104 (pad oxide) and a nitride layer 106 (pad nitride). A hard mask layer (not shown) is deposited on pad stack 101 and patterned using lithographic techniques known to those skilled in the art. For example, a resist layer may be deposited on hardmask layer, exposed and developed to open up holes at locations where trenches 110 are to be formed. Formation of trench 110 is preferably formed by employing an anisotropic etch, such as a reactive ion etch (RIE). Trench 110 is etched into substrate 102.

A buried plate 112 is formed at a lower portion of trench 110. Buried plate 112 may be formed by an ion implantation process or other implantation process. Dopant ions employed to form buried plate 112 are implanted deep enough into substrate 102 or in a sufficient quantity to ensure formation of buried plate 112. The dopants may be diffused outward by an anneal process after implantation. Other buried plate formation processes may be employed as well. Dopants or ions employed may be of a type and quantity consistent with a given design and sufficient to function (after implanted) as a capacitor electrode.

A collar 116 is formed in an upper portion of trench 110. Collar 116 is formed on substrate 102 preferably by performing an oxidation of the silicon in substrate 102, or by a deposition process employing TEOS or equivalents. Other processes may be employed to form collar 116 as well. Collar 116 is formed to prevent parasitic leakage currents from discharging the trench capacitor in operation. Collar 116 may be annealed to densify the oxide material. A nitride liner 111 is deposited to function as a capacitor dielectric between buried plate 112 and a storage node (see filler material 113).

Trench 110 is now filled with a conductive filler material 113, preferably a doped polysilicon to form the storage node. Filler material 113 is recessed to point 109 below collar 116 in trench 110.

Figure 2:
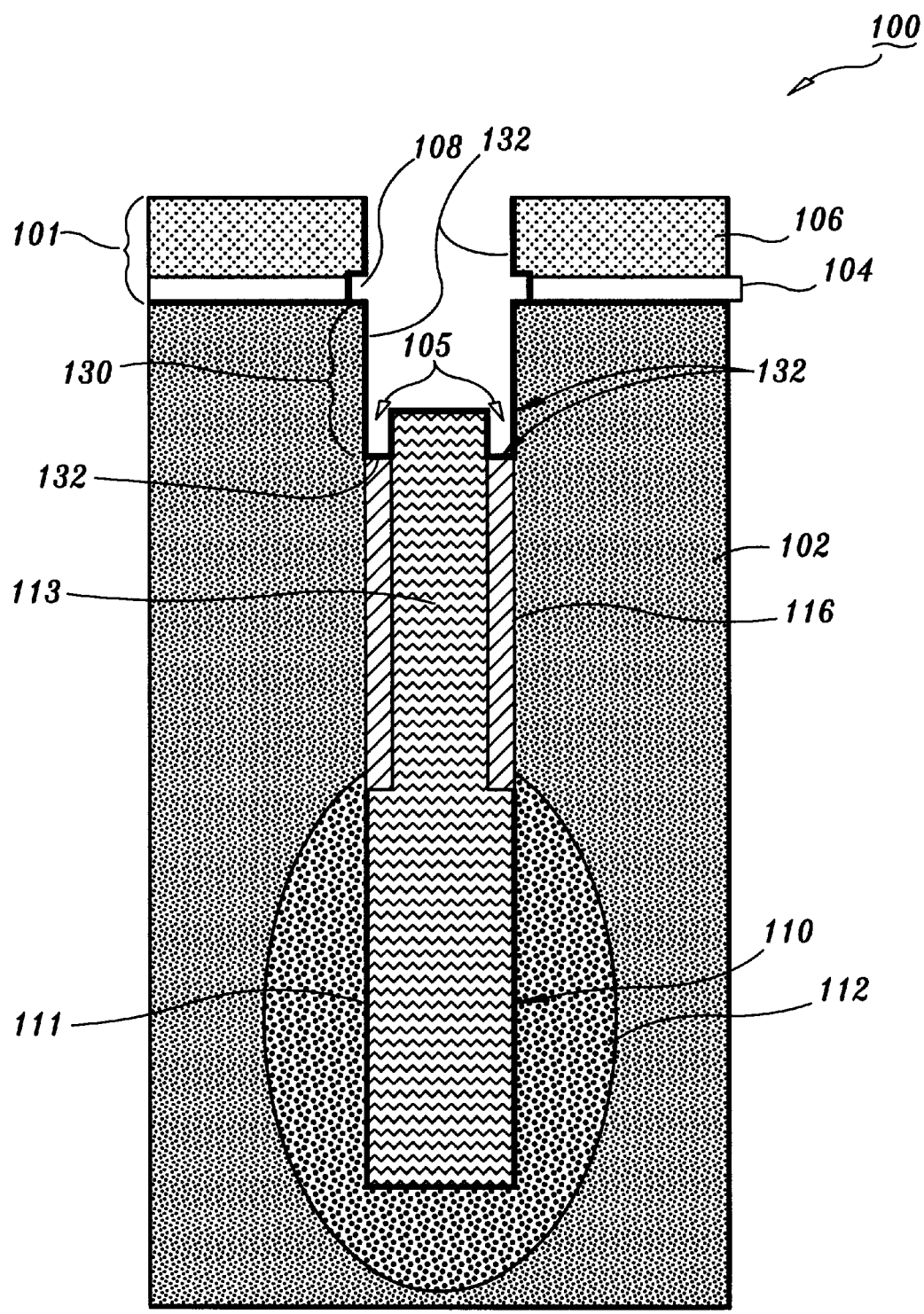
FIG. 2 is a cross-sectional view of the semiconductor device of FIG. 1 having a nitride layer grown on the recessed filler material and sidewalls of the trench in accordance with the present invention.

Referring to FIG. 2, an etch process is employed to etch a divot 105 by recessing a portion 130 of collar 116. This etching may cause pad oxide 104 to be etched forming a recess 108 therein. A high temperature nitridation is performed to form an ultra-thin (about 0.8 nm) nitride liner (or layer) 132. Other ultra-thin dielectrics may also be suitable. Nitride liner 132 forms on silicon surfaces. The nitridation process may include employing ammonia gas at between about 550 to about 600 degrees Celsius. This nitride liner 132 reduces defect generation from a buried strap interface which is the root cause for variable retention time (VRT) problems in deep trench capacitors. Advantageously, nitride liner 132 is employed by the present invention to improve processing as will be described below in greater detail.

Figure 3:
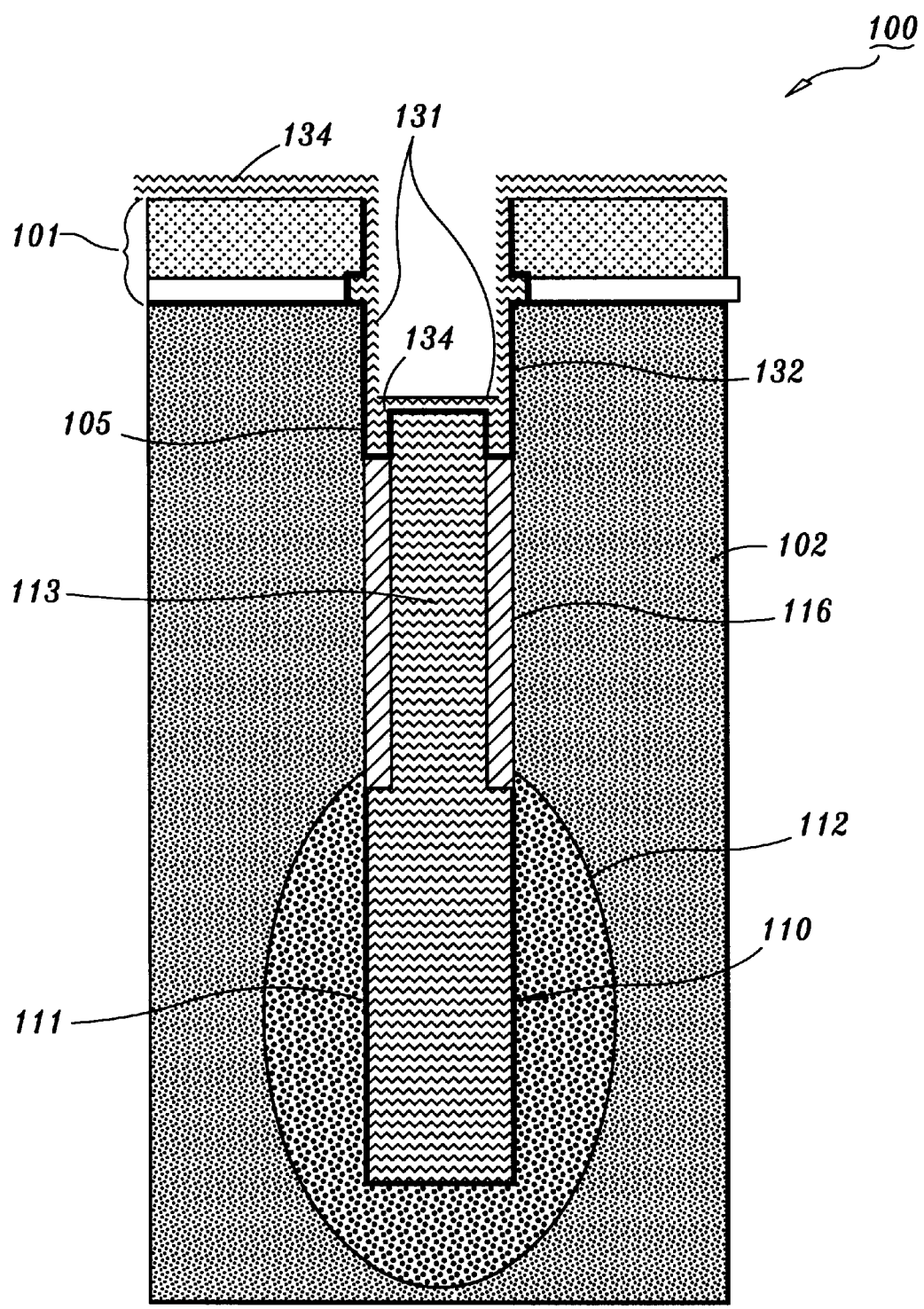
FIG. 3 is a cross-sectional view of the semiconductor device of FIG. 2 having a second filler material prepared for wet etching in accordance with the present invention.

Referring to FIG. 3, divot 105 is filled with a conductive filler material 134, preferably doped polysilicon. Filler material 134 is deposited preferably by a chemical vapor deposition (CVD) process, which covers all of the exposed surfaces with a layer of filler material 134.

In accordance with the present invention, filler material 134 is etched to prepare the surface. The preparation step may employ a wet etch, a dry etch or other process steps capable of removing native oxygen from the surface. In a preferred embodiment, the preparation step employs a diluted hydrofluoric (200 to 1) wet etch to prepare the surface for further processing. The preparation step may include other processes, such as an HF vapor etch or an $H_2$ bake, for example. The preparation step creates a hydrogen terminated surface 131. By reacting HF with Si, hydrogen atoms remain at the surface. Other preparation processes are contemplated provided a hydrogen terminated silicon surface results. The preparation step may be omitted in some embodiments if native oxide is removed in conjunction with other process steps. The surface of filler material 134 is ready for further processing. The wet etch preparation step is preferably selective to the silicon of substrate 102. The preparation step creates a hydrogen terminated surface 131. By reacting HF with Si, hydrogen atoms remain on the surface of filler material 134. Other acids may be employed to prepare the surface.

Advantageously, the preparation of the surface of filler material 134 is performed at a temperature of about 25° C. The HF preparation process is preferably performed for between about 40 seconds to about 80 seconds, however other times may be used depending on the design and circumstances. Other preparation processes are also contemplated as long as a hydrogen terminated silicon surface is provided. The preparation step may be omitted in some embodiments.

Figure 4:
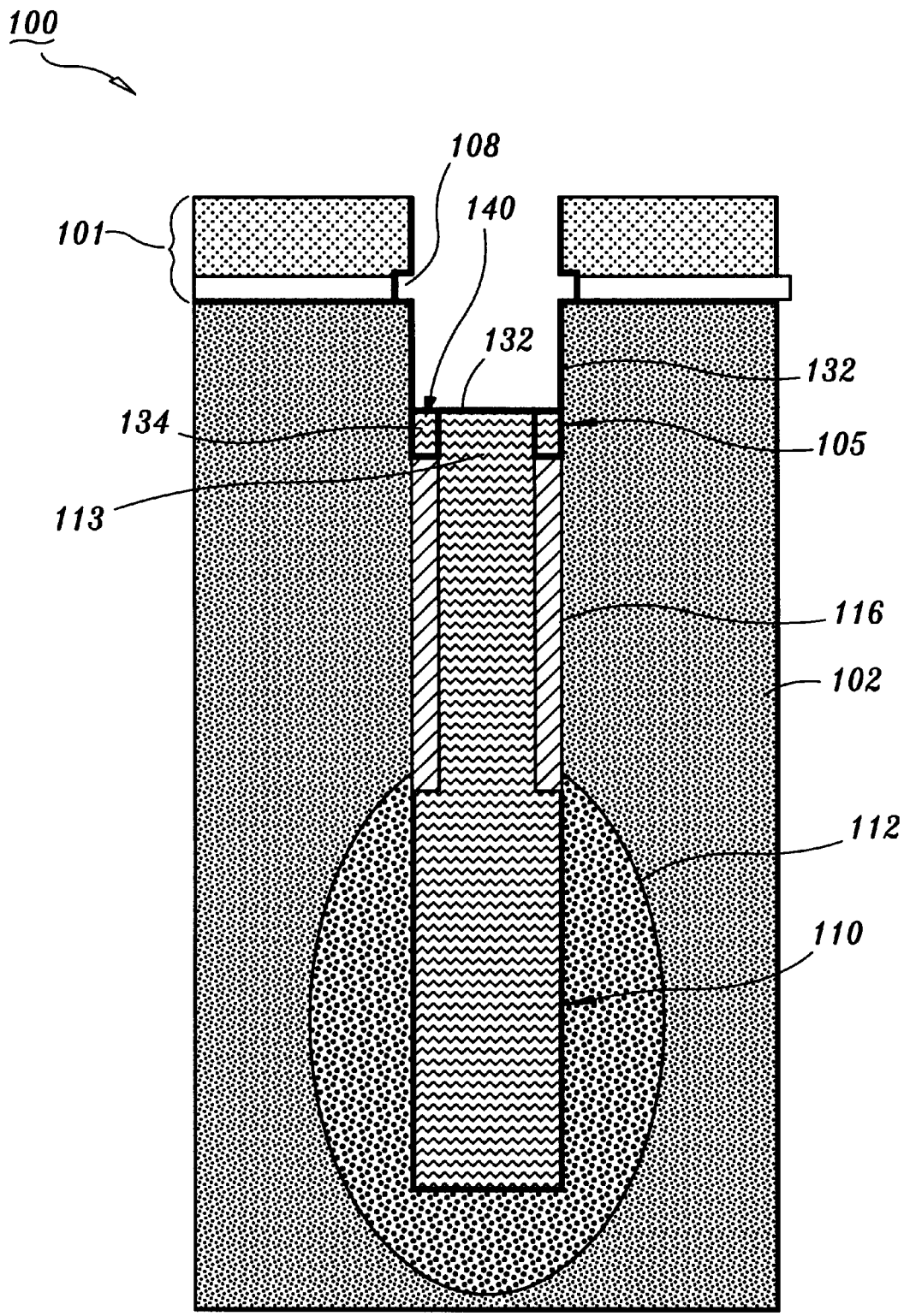
FIG. 4 is a cross-sectional view of the semiconductor device of FIG. 3 having the second filler material etched back by a wet etching process in accordance with the present invention.

Referring to FIG. 4, in accordance with the present invention, filler material 134 is etched by a wet etching process. The wet etching process is preferably employed for the buried strap polysilicon etch back. The wet etch process preferably includes a silicon etch by preferably employing a basic solution for example, $NH_4OH$ or KOH in aqueous solution. $NH_4OH$ and KOH are selective to silicon of substrate 102 and provides a selectivity ratio of at least about 40:1 relative to substrate 102, however, nitride liner 132 protects substrate from damage during the wet etch process of the present invention. Etching, in accordance with the present invention, is preferably performed in a temperature range of between about 25° C. to about 85° C. for between about 40 to about 800 seconds. These conditions are illustrative and may be adjusted for varying conditions or designs. In accordance with the present invention, the wet etching process activates the following reactions:

$$Si + 3OH^- \rightarrow Si(OH)^{++} + 4e^- \quad (1)$$

$$4H_2O + 4e^- \rightarrow 4OH^- + 2H_2 \qquad (2)$$

The silicon (Si) in the above reaction (1) is the silicon of filler material 134. By products, (e.g., Si(OH)$^{++}$) are carried away in the solution thereby etching back filler material 134. The amount of etchback is controlled by the amount of time, temperature and concentration of the etchant. This may be monitored carefully in a batch process employing processing tanks having controlled and monitored conditions. Advantageously, the batch process includes a high throughput without the disadvantages of the prior art (see above). The present invention substantially eliminates bulk silicon loss in the upper portion of the trench. Advantageously, nitride liner 132 is employed as an etch stop to protect silicon of substrate 102. Further, any deposited polysilicon in recesses 108 is removed selective to nitride during the wet etch. Advantageously, etching may be performed down to nitride layer 132 on storage node 113. A buried strap 140 is now formed in accordance with the present invention. Nitride liner 132 may be removed in later steps or left in place. Processing may now continue as is known in the art.

It is to be understood, that HF (for preparation) and NH$_4$OH (for wet etching) may be employed as etchants in different combinations or concentrations, or used in combination with other etchants or compounds. The process of the present invention may be employed for deep trench technology for both vertical and planar devices. Device 100 may include planar access transistors or vertical access transistors or both. The steps as outlined above are substantially the same for both planar and vertical access transistors. The structures of which are known in the art. The present invention includes at least the following advantages:

1. Better control. The process is highly selective to the ultra-thin (0.8 nm) nitride liner. Therefore, no overetch into the Si-surface occurs, and no polysilicon forms in the pad oxide undercut since any polysilicon can be removed from the pad oxide undercuts.

2. Cost reduction. For this wet process batch tools (e.g. tanks) can be used permitting the processing of many wafers simultaneously.

3. No specific tool necessary. The RIE process employed in the prior art for BSPE can only be performed with very specialized tools which are typically purchased for this purpose. For the present invention, any kind of wet etch tool can be used for the disclosed process resulting in a further cost reduction.

Figure 5:
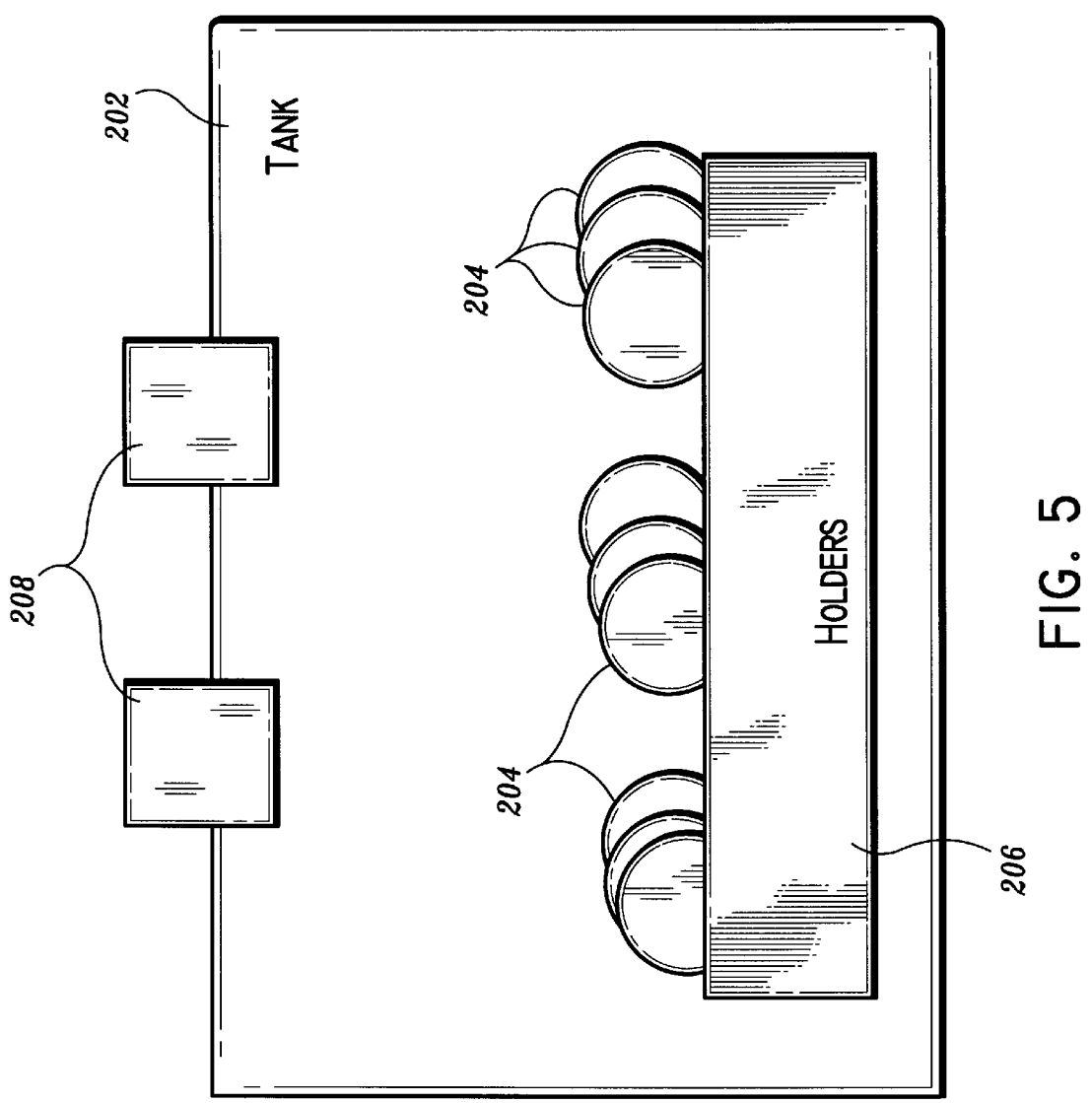
FIG. 5 is a schematic diagram of a tank for batch processing in accordance with the present invention.

Referring to FIG. 5, a tank 202 is shown for processing a plurality of wafers 204 simultaneously. Tank 202 includes wafer holders 206 which secures wafers 204 during processing. Tank 202 includes devices 208 for monitoring the wet etching process in accordance with the present invention. For example, tank 202 includes temperature monitoring equipment and concentration monitoring equipment for etchants in aqueous solution.

Having described preferred embodiments for a improved buried strap poly etch back (BSPE) process (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by letters patent is set forth in the appended claims:

What is claimed is:

1. A method for etching back filler material for a buried strap in deep trench capacitors comprising the steps of:

forming a trench in a substrate;

filling the trench with a first filler material;

recessing the first filler material to a depth relative to a dielectric collar formed in the trench;

etching a divot in the dielectric collar;

depositing a liner over the first filler material and portions of the substrate exposed by the formation of the trench;

depositing a second filler material on the liner and in the divot;

preparing a surface of the second filler material by etching the surface with a wet etchant to provide a hydrogen terminated silicon surface; and wet etching the second filler material to etch back the second filler material selective to the liner and the substrate, the second filler material being etched to form a buried strap.

2. The method as recited in claim 1, wherein the step of preparing a surface includes the step of preparing the surface by wet etching the surface with hydrogen fluoride.

3. The method as recited in claim 2, wherein the step of preparing a surface includes the step of preparing the surface by wet etching the surface at a temperature of about 25° C.

4. The method as recited in claim 1, wherein the step of wet etching includes the step of wet etching the second filler material by employing a base chemistry.

5. The method as recited in claim 4, wherein the base chemistry includes one of ammonium hydroxide and potassium hydroxide.

6. The method as recited in claim 1, wherein the step of wet etching includes the step of wet etching the second filler material at temperatures of between about 25° C. to about 85° C.

7. The method as recited in claim 1, wherein the step of wet etching includes the step of wet etching the second filler material in a batch process.

8. The method as recited in claim 1, wherein the second filler material includes polysilicon.

9. The method as recited in claim 1, wherein the liner includes nitride.

10. The method as recited in claim 9, wherein the nitride includes a thickness of about 0.8 nm.

11. The method as recited in claim 1, wherein the step of wet etching includes the step of wet etching the second filler material selective to the substrate with a selectivity of at least 40 to 1.

12. A method for etching back polysilicon selective to crystalline silicon for semiconductor fabrication comprising the steps of:

providing a crystalline silicon substrate having trenches formed therein;

forming an oxide collar in an upper portion of the trenches;

depositing a polysilicon material in the trenches and recessing the polysilicon material to a depth below a top portion of the oxide collar;

recessing the oxide collar to form a divot in each trench;

depositing a liner along exposed surfaces of the substrate in the trenches, in the divots and on the polysilicon material;

depositing a filler material to fill the trenches and divots;

preparing a surface of the filler material by etching the surface with a wet etchant to provide a hydrogen terminated silicon surface; and wet etching the filler material by employing a base chemistry to etch back the filler material selective to the substrate and the liner to form a buried strap.

13. The method as recited in claim 12, wherein the step of preparing a surface includes the step of preparing the surface by wet etching the surface with hydrogen fluoride.

14. The method as recited in claim 13, wherein the step of preparing a surface includes the step of preparing the surface by wet etching the surface at a temperature of about 25° C.

15. The method as recited in claim 12, wherein the step of wet etching includes the step of wet etching the filler material by employing ammonium hydroxide for between about 40 second to about 140 seconds.

16. The method as recited in claim 12, wherein the step of wet etching includes the step of wet etching the filler material at temperatures of between about 25° C. to about 85° C.

17. The method as recited in claim 12, wherein the step of wet etching includes the step of wet etching the filler material in a batch process.

18. The method as recited in claim 12, wherein the filler material includes polysilicon.

19. The method as recited in claim 12, wherein the liner includes nitride.

20. The method as recited in claim 19, wherein the nitride includes a thickness of about 0.8 nm.

21. The method as recited in claim 12, wherein the step of wet etching includes the step of wet etching the filler material selective to the substrate with a selectivity of at least 40 to 1.

22. A method for etching back polysilicon selective to crystalline silicon for forming a buried strap for a deep trench capacitor comprising the steps of:

providing a crystalline silicon substrate having trenches formed therein;

forming an oxide collar in an upper portion of the trenches depositing a polysilicon material in the trenches and recessing the polysilicon material to a depth below a top portion of the oxide collar;

recessing the oxide collar to form a divot in each trench;

depositing a nitride liner along exposed surfaces of the substrate in the trenches, in the divots and on the polysilicon material;

depositing a second polysilicon material to fill the trenches and divots;

preparing a surface of the second polysilicon material by etching the surface with hydrogen fluoride at a temperature of about 25° C. to provide a hydrogen terminated silicon surface; and wet etching the second polysilicon material to form a buried strap in each trench by employing one of ammonium hydroxide and potassium hydroxide at temperatures of between about 25° C. to about 85° C. to etch back the second polysilicon material selective to the substrate and the nitride liner in a batch process.

23. The method as recited in claim 22, wherein the step of wet etching includes the step of wet etching the second polysilicon material by employing ammonium hydroxide for between about 40 seconds to about 800 seconds.

24. The method as recited in claim 22, wherein the nitride liner includes a thickness of about 0.8 nm.

25. The method as recited in claim 22, wherein the step of wet etching includes the step of wet etching the second polysilicon material selective to the substrate with a selectivity of at least 40 to 1.

* * * * *